United States Patent
Maulik

(10) Patent No.: US 6,281,751 B1
(45) Date of Patent: Aug. 28, 2001

(54) FREQUENCY COMPENSATION FOR SINGLE-ENDED CLASS AB OPERATIONAL AMPLIFIERS WITH FULLY-DIFFERENTIAL INPUT STAGES

(75) Inventor: Prabir C. Maulik, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 09/375,165

(22) Filed: Aug. 16, 1999

(51) Int. Cl.[7] ............................................. H03F 3/45
(52) U.S. Cl. ........................ 330/255; 330/259; 330/292
(58) Field of Search .................................. 330/255, 259, 330/292, 295, 257, 288

(56) References Cited

U.S. PATENT DOCUMENTS

| | | | |
|---|---|---|---|
| 3,419,809 | * 12/1968 | Lach et al. | 330/10 |
| 3,430,152 | * 2/1969 | Walsh | 330/2 |
| 4,015,212 | * 3/1977 | Miyata | 330/13 |
| 4,049,977 | * 9/1977 | Radovsky | 307/262 |
| 4,065,726 | * 12/1977 | Senger | 330/288 |
| 4,267,519 | * 5/1981 | Schade, Jr. | 330/255 |
| 4,485,351 | * 11/1984 | Schemmel et al. | 330/288 |
| 4,531,100 | * 7/1985 | Adkin | 330/290 |
| 4,757,271 | * 7/1988 | Beale | 330/255 |
| 4,866,398 | * 9/1989 | Gulczynski | 330/263 |
| 4,956,615 | * 9/1990 | Bohme et al. | 330/288 |
| 5,216,380 | * 6/1993 | Carbou | 330/253 |
| 5,220,288 | * 6/1993 | Brooks | 330/255 |
| 5,554,958 | * 9/1996 | Donoghue | 330/149 |
| 5,990,748 | * 11/1999 | Tomasini et al. | 330/292 |

* cited by examiner

Primary Examiner—Robert Pascal
Assistant Examiner—Henry Choe

(57) ABSTRACT

A class AB operational amplifier has first and second intermediate differential nodes respectively driving intermediate stage inverting and non-inverting amplifiers to produce a single-ended output voltage, which are provided with a frequency compensating feedback signal at a selected one of the first and second intermediate differential nodes, derived from the single-ended output of the operational amplifier subject to frequency compensation. The frequency compensating feedback signal is generated with the feedback circuitry. The feedback circuitry includes a compensation capacitor connected to the single-ended output and a current mirror circuit connected to the selected one of the first and second intermediate differential nodes of the operational amplifier.

37 Claims, 10 Drawing Sheets

| FIG.5A |
| FIG.5B |

FREQUENCY COMPENSATION FOR SINGLE-ENDED CLASS AB OPERATIONAL AMPLIFIERS WITH FULLY-DIFFERENTIAL INPUT STAGES

BACKGROUND OF THE INVENTION

1. Field of the Invention

This application relates to operational amplifier methods and systems and more particularly to methods and systems for frequency compensation of class AB operational amplifiers (i.e., "opamps") with fully-differential input stages.

2. Description of Related Art

Some prevalent operational amplifier designs require frequency compensation to meet predetermined operational standards. In particular, class AB operational amplifiers having a single ended output and fully-differential input stages require frequency compensation to operate at an acceptable level. Single-ended class AB operational amplifiers have fully-differential input stages in some instances. This is because the non-linearity of the amplifier is dominated by the non-linearity of the input stage in many cases. A fully differential input stage is a balanced structure which is very linear. The non-linearity of the second stage is divided by the gain of the input stage.

A common way of compensating two-stage operational amplifiers is to connect a pole-splitting capacitor between a first stage high-impedance node and a second stage high-impedance node. The two stages are inverting with respect to each other. This causes one of the poles to move to a low frequency level, with the pole becoming dominant, while the other pole moves to high frequency. According to Paul Gray and Robert Meyer in *Analysis and Design of Analog Integrated Circuits* (Wiley), if the new high frequency pole is above the crossover frequency of the operational amplifier, the stability of the operational amplifier is not detrimentally affected.

Operational amplifiers are configured as line drivers in digital subscriber lines (DSL) and as preamplifiers in sensing systems having an input sensor connected to a preamplifier which in turn drives an analog to digital converter. *ADSL and DSL Technologies* by Walter Goralski (McGraw-Hill 1998) describes DSL systems in which such operational amplifiers can be used.

A major technical problem in the design of single-ended output and fully-differential input operational amplifiers is degraded performance due to lack of balanced frequency compensation. Accordingly, circuit designers avoid using such operational amplifiers because of their inadequate performance characteristics. Accordingly, it is desired to develop more refined operational amplifier designs that will enable class AB amplifiers to operate at enhanced levels without suffering from degraded performance.

SUMMARY OF THE INVENTION

According to the present invention, an operational amplifier has a single-ended output and fully-differential input stages, respectively an output connection and first and second input connections. The operational amplifier includes a first operational amplifier stage including first and second output connections, or first and second intermediate differential nodes, i.e., respectively nodes P and Q. The operational amplifier further includes first and second intermediate stage inverting and non-inverting amplifiers connected at their respective inputs to respective ones of inputs P and Q. The operational amplifier according to the present invention further includes first and second output transistors connected at a common node, including a single-ended output for said operational amplifier, each of said first and second output transistors having a gate connected to the output of said first and second intermediate stage inverting and non-inverting amplifiers. The operational amplifier further includes frequency compensating feedback circuitry including a compensation capacitor connected to said single-ended output of the operational amplifier. According to one embodiment of the present invention, the frequency compensating feedback circuitry further includes a current mirror circuit which is connected to a selected one of the first and second intermediate differential nodes P and Q.

According to one embodiment of the present invention, a class AB operational amplifier having first and second intermediate differential nodes respectively driving intermediate stage inverting and non-inverting amplifiers to produce a single-ended output voltage is provided with a frequency compensating feedback signal at a selected one of the first and second intermediate differential nodes, which is derived from the single-ended output of the operational amplifier subject to frequency compensation. The frequency compensating feedback signal is generated with feedback circuitry according to the present invention. The feedback circuitry according to one embodiment includes a compensation capacitor connected to the single-ended output and a current mirror circuit connected to the selected one of the first and second intermediate differential nodes of the operational amplifier.

DETAILED DESCRIPTION OF A PREFERRED MODE

Figure 1A:
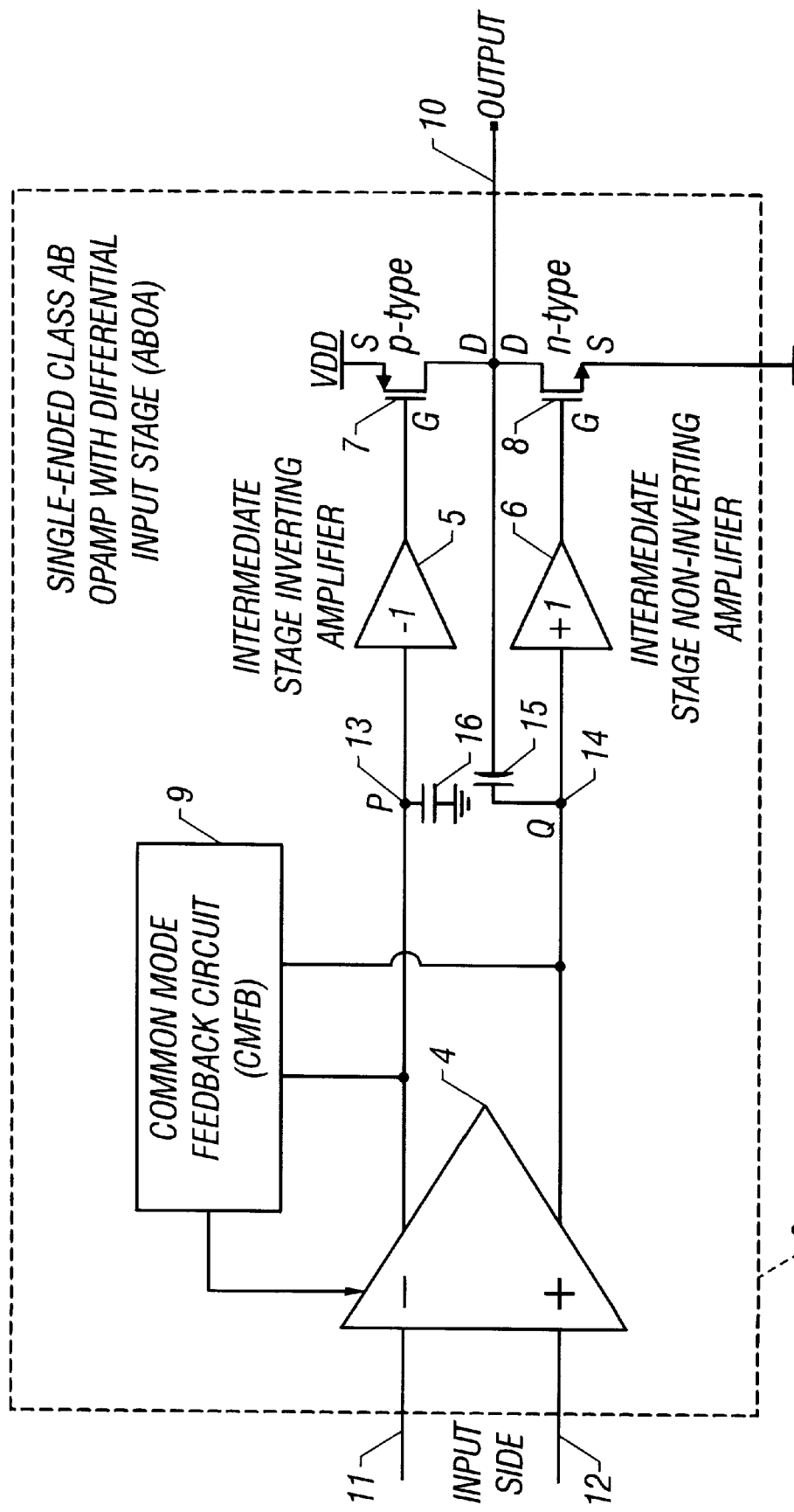
FIG. 1A is a circuit diagram of a class AB operational amplifier having a single-ended output and fully-differential input stages, according to the prior art.

Referring now to FIG. 1A, there is shown a circuit diagram of a class AB operational amplifier 3 having a single-ended output and fully-differential input stages, according to the prior art. In particular, FIG. 1 shows operational amplifier 3 including a first operational amplifier stage 4, first and second intermediate stage inverting and non-inverting amplifiers respectively 5 and 6, first and second output transistors respectively 7 and 8, and a common-mode feedback circuitry (CMFB) 9 connected to the first operational amplifier stage 4. Operational amplifier 3 further includes an output connection 10, and first and second input connections 11 and 12 to the first operational amplifier stage 4. The first operational amplifier stage 4 further includes first and second output connections respectively 13 and 14, also referred to as first and second intermediate differential nodes, i.e., respectively nodes P and Q. First and second intermediate stage inverting and non-inverting amplifiers 5 and 6 are connected at their respective inputs to inputs P and Q (i.e., respectively 13 and 14). According to one embodiment of the present invention, respective output transistors 7 and 8 are complementary metal oxide silicon (CMOS) transistors connected in series between VDD and ground and connected to each other at a common node 10 which is the output connection of operational amplifier 3. According to one embodiment of the present invention, respective output transistors 7 and 8 are respectively p-type and n-type CMOS transistors, each having a source, a drain, and a gate connection. According to one embodiment of the present invention, respective output transistors 7 and 8 are connected to each other at their respective drain connections. According to one embodiment of the present invention, respective output transistors 7 and 8 are respectively connected to VDD and ground at their source connections. According to one embodiment of the present invention, respective output transistors 7 and 8 are connected to the output connections of respective ones of first and second intermediate stage inverting and non-inverting amplifiers 5 and 6 at their respective gate connections. Common-mode feedback circuitry (CMFB) 9 is connected to the first operational amplifier stage 4 and to respective ones of nodes P and Q (i.e., respectively 13 and 14). Node 13 has a capacitor 16 connected to ground, and node 14 has a capacitor connected to the output 10. The fully differential input stage in FIG. 1 has two high impedance nodes P and Q, of which Q has an inverting relationship to the output. There is also a high impedance node at the output 10 of the amplifier 3.

Figure 1B:
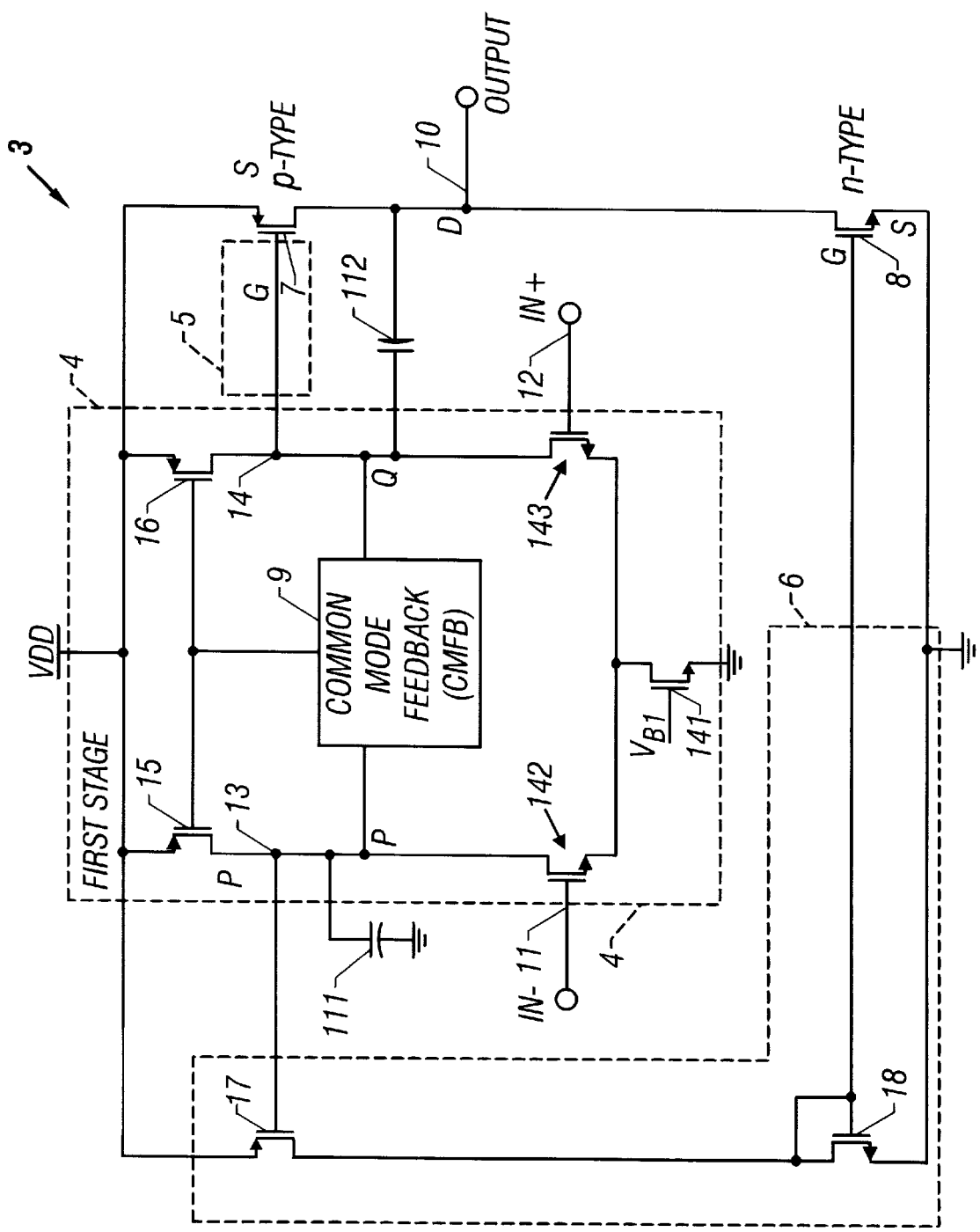
FIG. 1B is another circuit diagram of a class AB operational amplifier having a single-ended output and fully-differential input stages, according to the prior art.

FIG. 1B is another circuit diagram of a class AB operational amplifier 3 having a single-ended output and fully-differential input stages, according to the prior art. In particular, the FIG. shows operational amplifier 3 including a first operational amplifier stage 4, first and second intermediate stage inverting and non-inverting amplifiers respectively 5 and 6, first and second output transistors respectively 7 and 8, and a common-mode feedback circuitry (CMFB) 9 connected to the first operational amplifier stage 4. Operational amplifier 3 further includes an output connection 10, and first and second input connections to the first operational amplifier stage 4. The first operational amplifier stage 4 further includes first and second output connections respectively 13 and 14, also referred to as first and second intermediate differential nodes, i.e., respectively nodes P and Q. First and second intermediate stage inverting and non-inverting amplifiers 5 and 6 are connected at their respective inputs to inputs P and Q (i.e., respectively 13 and 14). According to one embodiment of the present invention, respective output transistors 7 and 8 are complementary metal oxide silicon (CMOS) transistors connected in series between VDD and ground and connected to each other at a common node 10 which is the output connection of operational amplifier 3. According to one embodiment of the present invention, respective output transistors 7 and 8 are respectively p-type and n-type CMOS transistors, each having a source, a drain, and a gate connection. According to one embodiment of the present invention, respective output transistors 7 and 8 are connected to each other at their respective drain connections. According to one embodiment of the present invention, respective output transistors 7 and 8 are respectively connected to VDD and ground at their source connections. According to one embodiment of the present invention, respective output transistors 7 and 8 are connected to the output connections of respective ones of first and second intermediate stage inverting and non-inverting amplifiers 5 and 6 at their respective gate connections. Common-mode feedback circuitry (CMFB) 9 is connected to the first operational amplifier stage 4 and to nodes P and Q (i.e., respectively 13 and 14). The capacitor 112 is connected between node Q and the output, and capacitor 111 is connected to ground from node P to ground, to effect a desired frequency compensation. However, this leaves the first stage unbalanced, because the displacement currents flowing into each capacitor are widely different. This unbalancing of the first stage nullifies the reason for having a fully-differential first stage.

Figure 2:
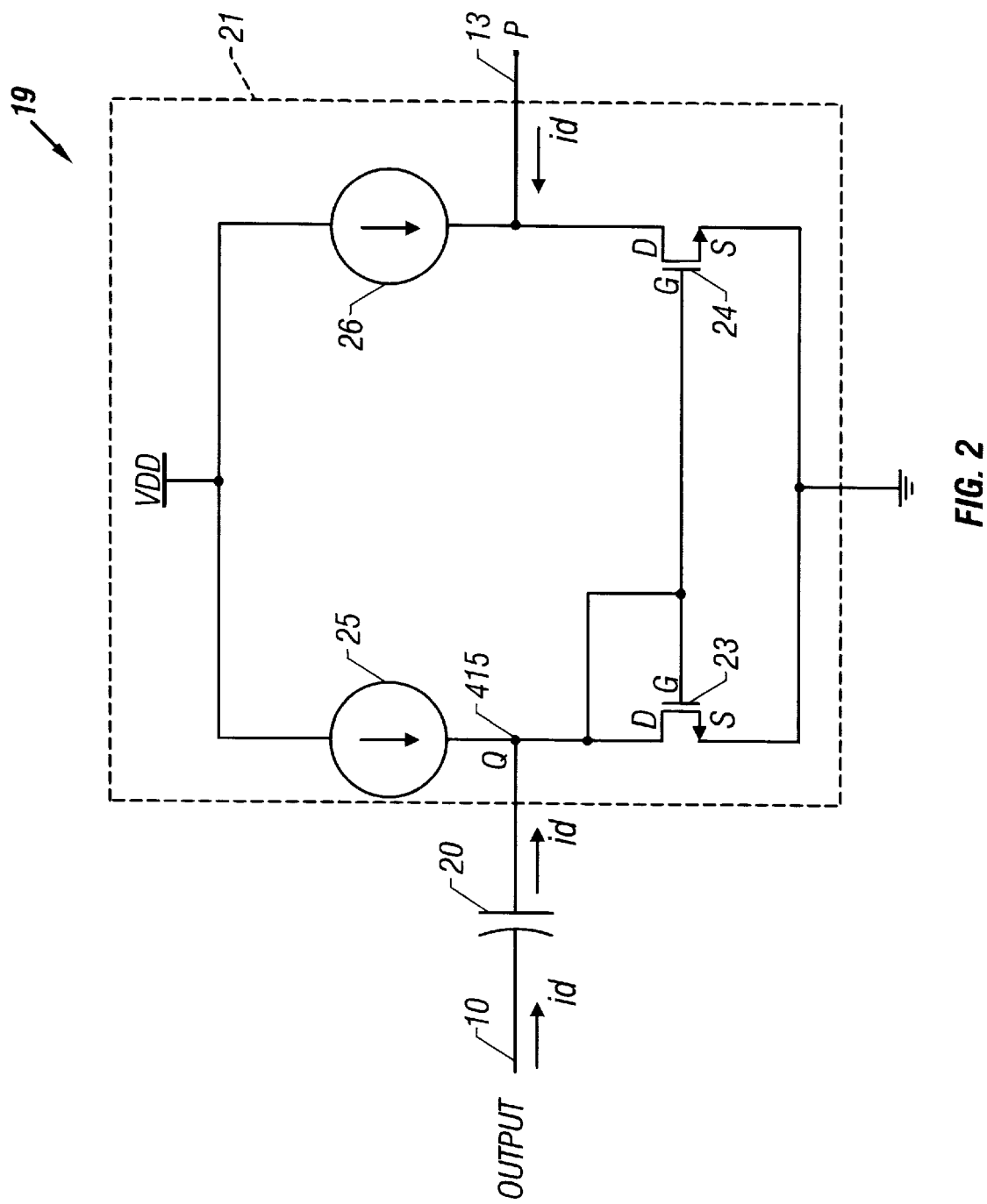
FIG. 2 is a circuit diagram of feedback circuitry according to one embodiment of the present invention, which includes a compensation capacitor connected to a single-ended output and a current mirror circuit in turn connected to the selected one of the first and second intermediate differential nodes of a class AB operational amplifier having a single-ended output and fully-differential input stages.

Referring now to FIG. 2, there is shown a circuit diagram of feedback circuitry 19 according to one embodiment of the present invention, designed to keep the magnitudes of the displacement current in the first stage outputs substantially the same. The feedback circuitry 19 according to the present invention, includes a compensation capacitor 20 connected to single-ended output 10 of the operational amplifier 3. The feedback circuitry 19 further includes a current mirror circuit 21 which in turn is connected to node P. The current mirror circuit 21 according to one embodiment of the present invention includes first and second current mirror transistors respectively 23 and 24, and first and second current sources respectively 25 and 26. First and second current sources 25 and 26 are connected at their respective inputs to VDD and at their respective outputs to first and second current mirror transistors 23 and 24. Additionally, first and second current sources 25 and 26 are connected at their respective outputs to compensation capacitor 20 and to a selected one of nodes P and Q (i.e., respectively 13 and 14). According to one embodiment of the present invention, second current source 26 is connected at its output to node P (i.e., node 13). According to one embodiment of the present invention, respective current mirror transistors 23 and 24 are complementary metal oxide silicon (CMOS) transistors connected in parallel. According to one embodiment of the present invention, respective transistors 23 and 24 are n-type CMOS transistors, each having a source, a drain, and a gate connection. According to one embodiment of the present invention, respective transistors 23 and 24 are connected to each other at their respective gate connections. According to one embodiment of the present invention, the gate and drain connections of current mirror transistor 23 are connected to each other, to establish a current mirror relationship with current mirror transistor 24. According to one embodiment of the present invention, transistor 24 is connected at its drain to the output of second current source 26 and to the node P (i.e., node 13). The current mirror relationship assures that the displacement current flowing from node 415 into the drain of transistor 23 is also flowing from node 13 (i.e., node P) into the drain of transistor 24. This achieves current inversion for node according to which the displacement current is pulled out of node P (i.e., node 13). The current mirror relationship assures that the displacement current flowing from 20 into drain D of 23 is also flowing into drain D of transistor 24 thus achieving a current inversion.

Figure 3:
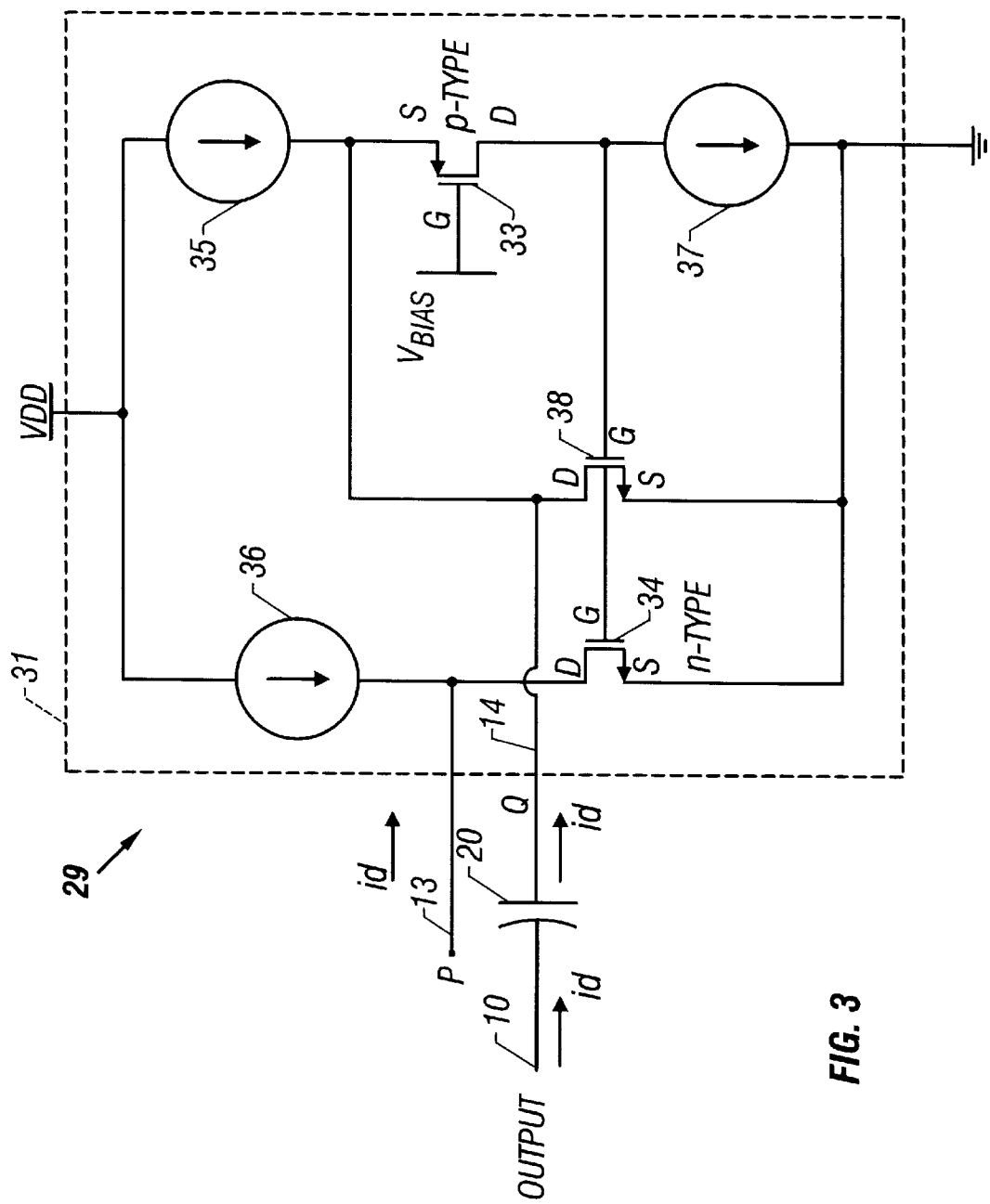
FIG. 3 is a circuit diagram of feedback circuitry according to another embodiment of the present invention, which includes a compensation capacitor connected to the single-ended output of the operational amplifier and a current mirror circuit in turn connected to the selected one of the first and second intermediate differential nodes of a class AB operational amplifier having a single-ended output and fully-differential input stages.

Referring now to FIG. 3, there is shown a circuit diagram of feedback circuitry 29 according to another embodiment of the present invention, which includes a compensation capacitor 20 connected to the single-ended output 10 of the class AB operational amplifier 3 in FIG. 1 and a current mirror circuit 31 in turn connected to the selected one of the first and second intermediate differential nodes P and Q of the class AB operational amplifier 3. Referring now to FIG. 3, there is shown a circuit diagram of feedback circuitry 29 according to one embodiment of the present invention, which includes a compensation capacitor 20 connected to single-ended output 10 of the operational amplifier 3, and further includes a current mirror circuit 31 which in turn is connected to the selected one of the first and second intermediate differential nodes P and Q (i.e., respectively 13 and 14). The current mirror circuit 31 according to one embodiment of the present invention includes first, second, and third transistors respectively 33, 34, and 38; and first, second, and third current sources respectively 35, 36, and 37, respectively. First and second current sources 35 and 36 are connected at their respective inputs to VDD and at their respective outputs to first and second transistors 33 and 34. Additionally, first and second current sources 35 and 36 are connected at their respective outputs to compensation capacitor 20 and to a selected one of nodes P and Q (i.e., respectively 13 and 14). According to one embodiment of the present invention, second current source 36 is connected at its output to node P (i.e., node 13). According to one embodiment of the present invention, respective transistors 33, 34, and 38 are complementary metal oxide silicon (CMOS) transistors connected in parallel. Further, transistors 34 and 38 are connected to each other at ground. Additionally, transistors 33 and 38 are connected to each other at their respective source and drain connections. According to one embodiment of the present invention, respective transistors 33, 34, and 38 are respectively p-type, n-type, and n-type CMOS transistors, and each of them has a source, a drain, and a gate connection. According to one embodiment of the present invention, respective transistors 34 and 38 are connected to each other at their respective gate connections. According to one embodiment of the present invention, the gate connections of transistors 34 and 38 are connected to each other and to the drain connection of transistor 33. According to one embodiment of the present invention, transistor 34 is connected at its drain to the output of second current source 36 and to the node P (i.e., node 13). Further, the compensation capacitor 20 is connected to the drain connection of transistor 38 and to the source connection of transistor 33. Current flowing from capacitor 20 into drain D of transistor 38 is also flowing from node 13 into drain D of transistor 34, thus achieving a current inversion.

Figures 4, 4A:
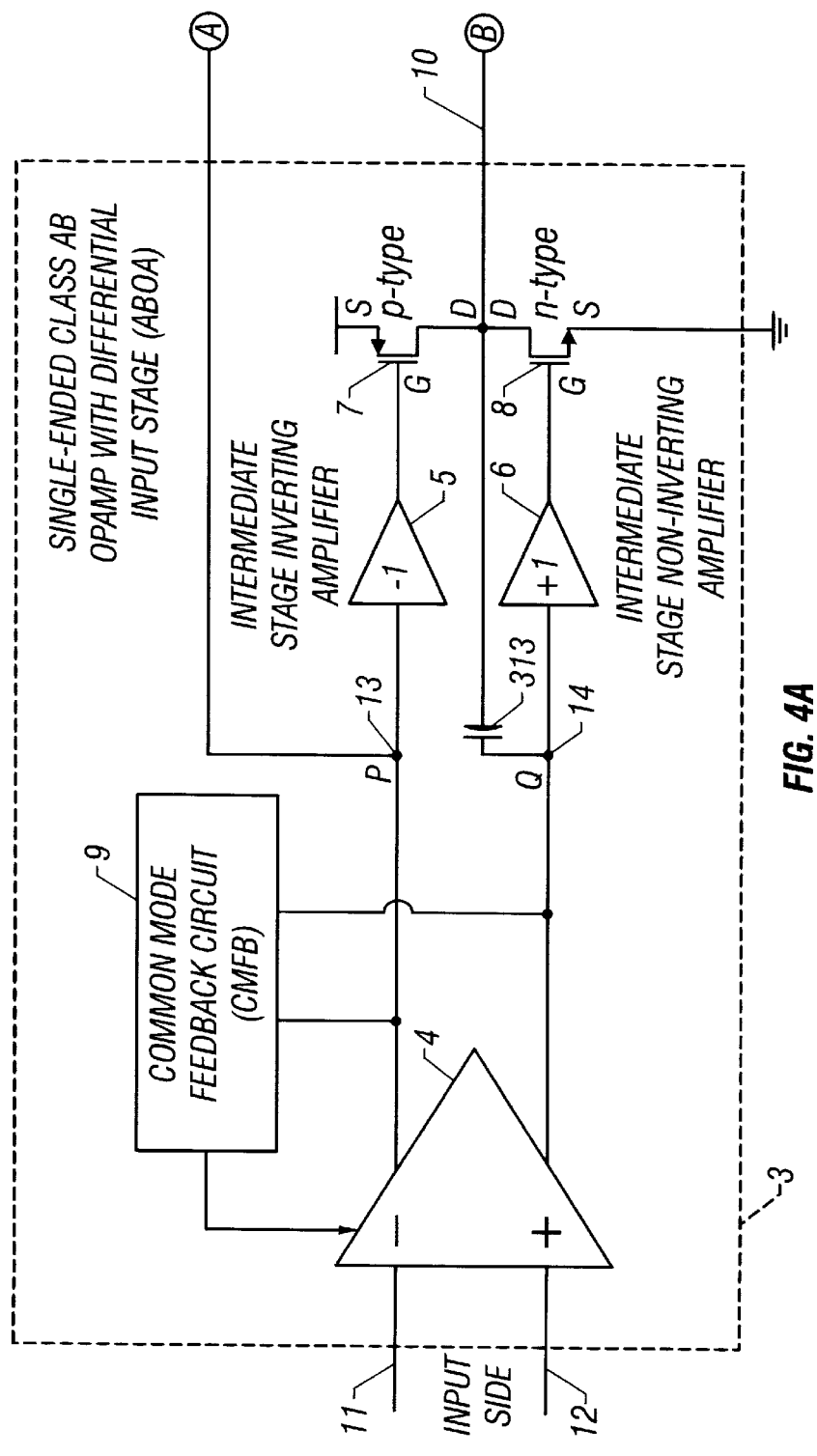
FIGS. 4, 4A, and 4B is a circuit diagram of a class AB operational amplifier having a single-ended output and fully-differential input stages, including feedback circuitry according to one embodiment of the present invention, which includes a compensation capacitor connected to a single-ended output and a current mirror circuit in turn connected to the selected one of the first and second intermediate differential nodes of a class AB operational amplifier having a single-ended output and fully-differential input stages.
Figure 4B:
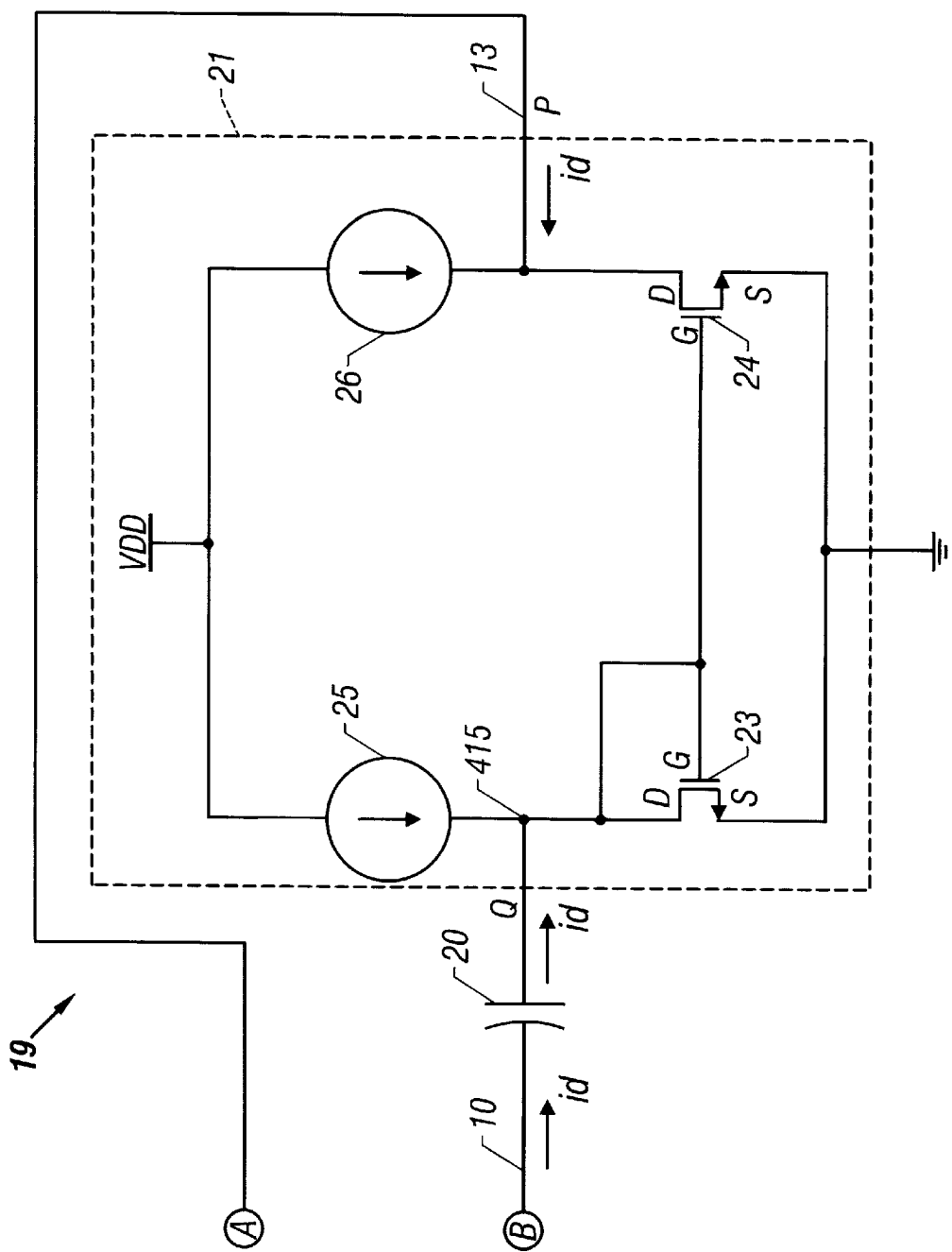

Referring now to FIGS. 4, 4A, and 4B, there is shown a circuit diagram of a class AB operational amplifier 3 having a single-ended output and fully-differential input stages, including feedback circuitry 19 according to one embodiment of the present invention, which includes a compensation capacitor 20 connected to a single-ended output 10 and a current mirror circuit 21 in turn connected to the selected one of the first and second intermediate differential nodes 415 and 13 of a class AB operational amplifier having a single-ended output and fully-differential input stages. Further in FIGS. 4, 4A, and 4B, there is shown a circuit diagram of feedback circuitry 19 (e.g., see also FIG. 2) according to one embodiment of the present invention, which includes a compensation capacitor 20 connected to single-ended output 10 of the operational amplifier 3, and further includes a current mirror circuit 21 which in turn is connected to the selected one of the first and second intermediate differential nodes P and Q (i.e., respectively 13 and 415). The current mirror circuit 21 according to one embodiment of the present invention includes first and second current mirror transistors respectively 23 and 24, and first and second current sources respectively 25 and 26. First and second current sources 25 and 26 are connected at their respective inputs to VDD and at their respective outputs to first and second current mirror transistors 23 and 24. Additionally, first and second current sources 25 and 26 are connected at their respective outputs to compensation capacitor 20 and to a selected one of nodes P and Q (i.e., respectively nodes 13 and 14). According to one embodiment of the present invention, second current source 26 is connected at its output to node P (i.e., node 13). According to one embodiment of the present invention, respective current mirror transistors 23 and 24 are complementary metal oxide silicon (CMOS) transistors connected in parallel. According to one embodiment of the present invention, respective transistors 23 and 24 are n-type CMOS transistors, each having a source, a drain, and a gate connection. According to one embodiment of the present invention, respective transistors 23 and 24 are connected to each other at their respective gate connections. According to one embodiment of the present invention, the gate and drain connections of current mirror transistor 23 are connected to each other, to establish a current mirror relationship with current mirror transistor 24. According to one embodiment of the present invention, transistor 24 is connected at its drain to the output of second current source 26 and to the node P (i.e., node 13). The current mirror relationship assures that the displacement current flowing from node 415 into the drain of transistor 23 is also flowing from node 13 (i.e., node P) into the drain of transistor 24. This achieves current inversion for node according to which the displacement current is pulled out of node P.

Figures 5, 5A:
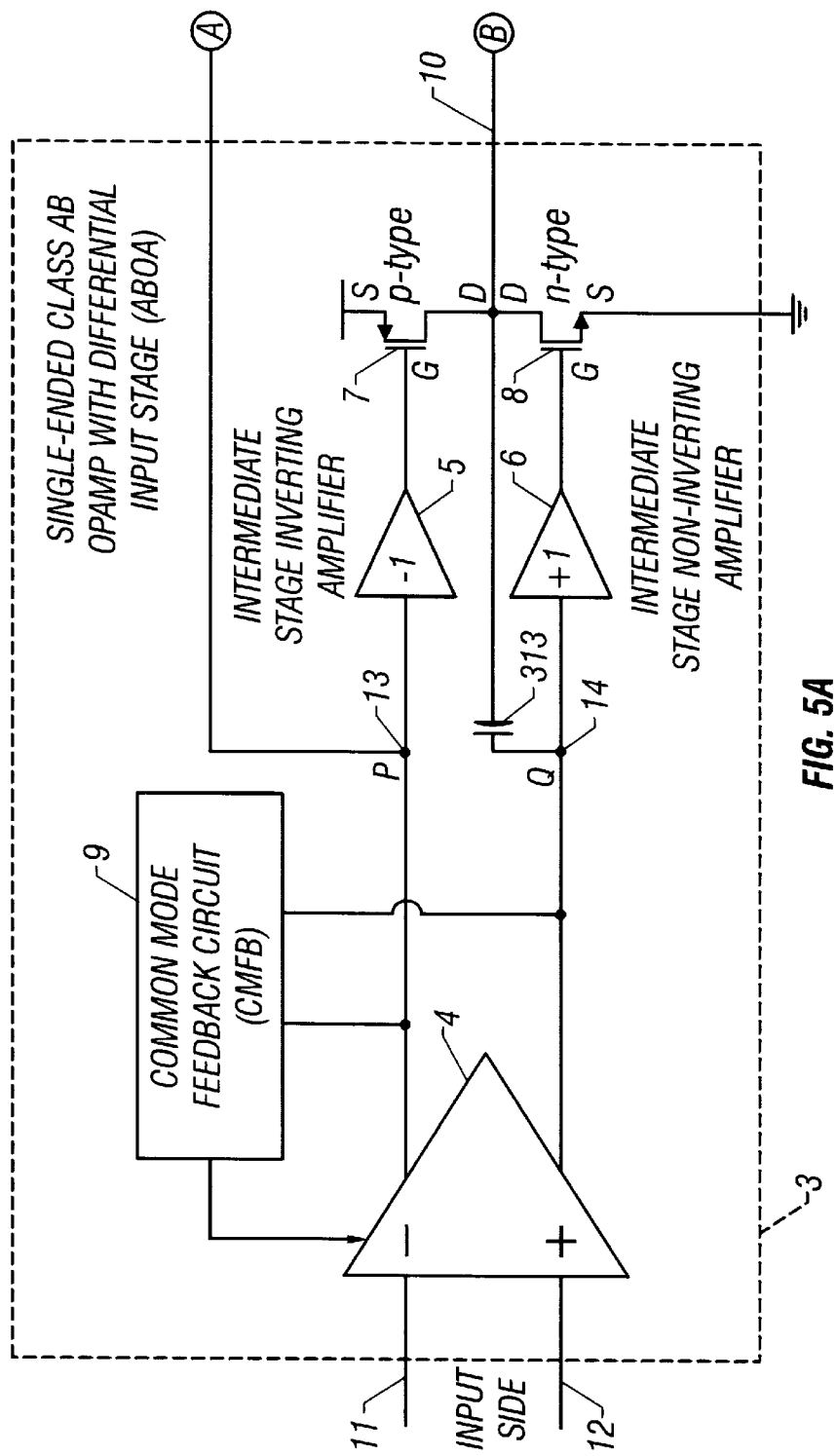
FIGS. 5, 5A, and 5B is a circuit diagram of another embodiment of a class AB operational amplifier according to the present invention, having a single-ended output and fully-differential input stages, including feedback circuitry including a compensation capacitor connected to a single-ended output and a current mirror circuit in turn connected to the selected one of the first and second intermediate differential nodes of the class AB operational amplifier.
Figure 5B:
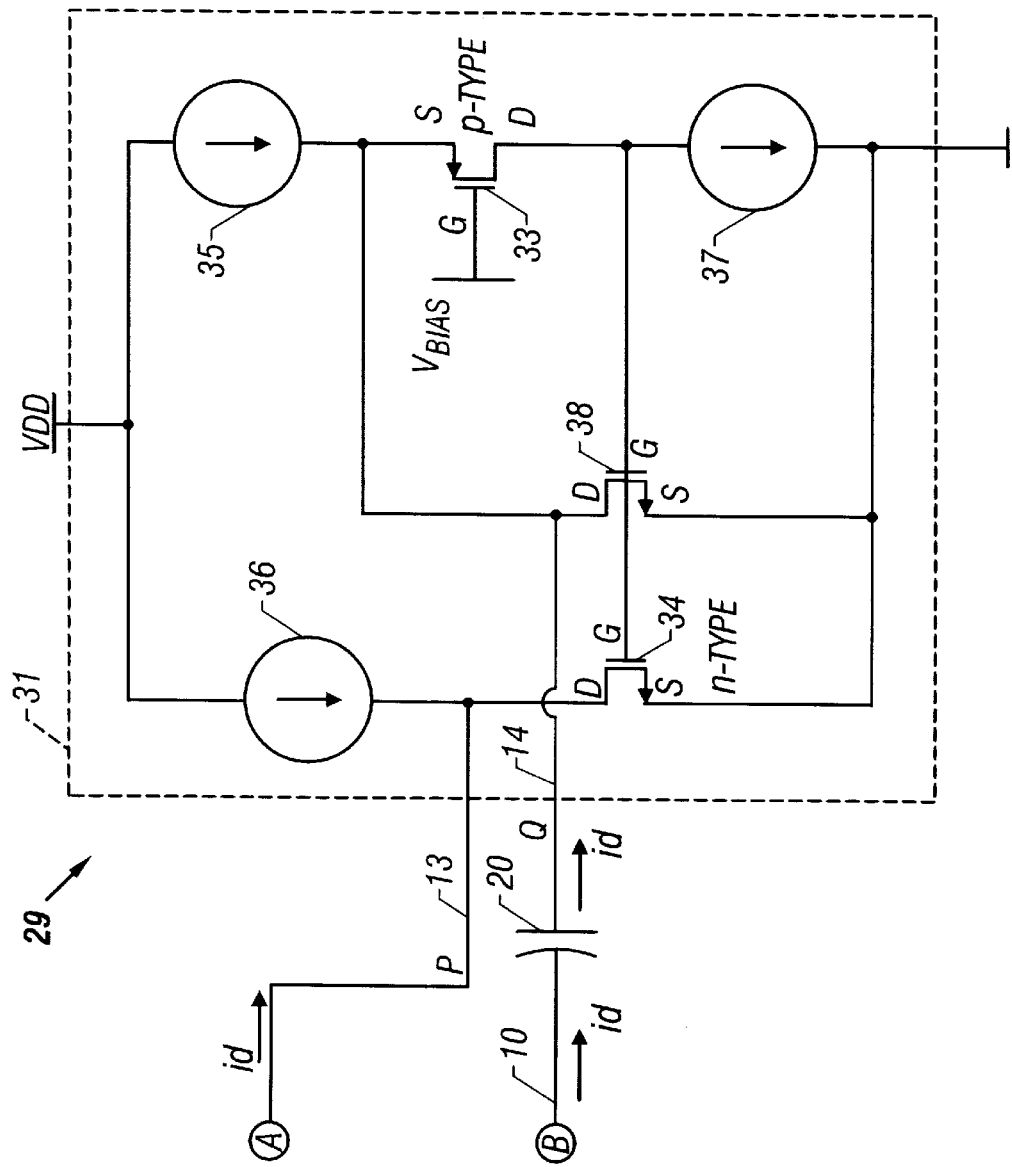

Referring now to FIGS. 5, 5A and 5B, there is shown a circuit diagram of another embodiment of a class AB operational amplifier 3 according to the present invention, having a single-ended output and fully-differential input stages, including feedback circuitry 29 including a compensation capacitor 20 connected to a single-ended output 10 and a current mirror circuit 31 in turn connected to the selected one of the first and second intermediate differential nodes of the class AB operational amplifier. Further in FIG. 5, there is shown a circuit diagram of feedback circuitry 29 according to another embodiment of the present invention, which includes a compensation capacitor 20 connected to the single-ended output 10 of the class AB operational amplifier 3 and a current mirror circuit 31 in turn connected to the selected one of the first and second intermediate differential nodes P and Q of the class AB operational amplifier 3. Referring now to FIGS. 5, 5A, and 5B, there is shown a circuit diagram of feedback circuitry 29 (see also FIG. 3) according to one embodiment of the present invention, which includes a compensation capacitor 20 connected to single-ended output 10 of the operational amplifier 3, and further includes a current mirror circuit 31 which in turn is connected to the selected one of the first and second intermediate differential nodes P and Q (i.e., respectively nodes 13 and 14). The current mirror circuit 31 according to one embodiment of the present invention includes first, second, and third transistors respectively 33, 34, and 38; and first, second, and third current sources respectively 35, 36, and 37, respectively. First and second current sources 35 and 36 are connected at their respective inputs to VDD and at their respective outputs to first and second transistors 33 and 34. Additionally, first and second current sources 35 and 36 are connected at their respective outputs to compensation capacitor 20 and to a selected one of nodes P and Q (i.e., respectively 13 and 14). According to one embodiment of the present invention, second current source 36 is connected at its output to node P (i.e., node 13). According to one embodiment of the present invention, respective transistors 33, 34, and 38 are complementary metal oxide silicon (CMOS) transistors connected in parallel. Further, transistors 34 and 38 are connected to each other at ground. Additionally, transistors 33 and 38 are connected to each other at their respective source and drain connections. According to one embodiment of the present invention, respective transistors 33, 34, and 38 are respectively p-type, n-type, and n-type CMOS transistors, and each of them has a source, a drain, and a gate connection. According to one embodiment of the present invention, respective transistors 34 and 38 are connected to each other at their respective gate connections. According to one embodiment of the present invention, the gate connections of transistors 34 and 38 are connected to each other and to the drain connection of transistor 33. According to one embodiment of the present invention, transistor 34 is connected at its drain to the output of second current source 36 and to the node P (i.e., node 13). Further, the compensation capacitor 20 is connected to the drain connection of transistor 38 and to the source connection of transistor 33. The current mirror relationship assures that the displacement current flowing from node 14 into the drain of transistor 38 is also flowing from node 13 (i.e., node P) into the drain of transistor 34. This achieves current inversion for node according to which the displacement current is pulled out of node P.

Figure 6:
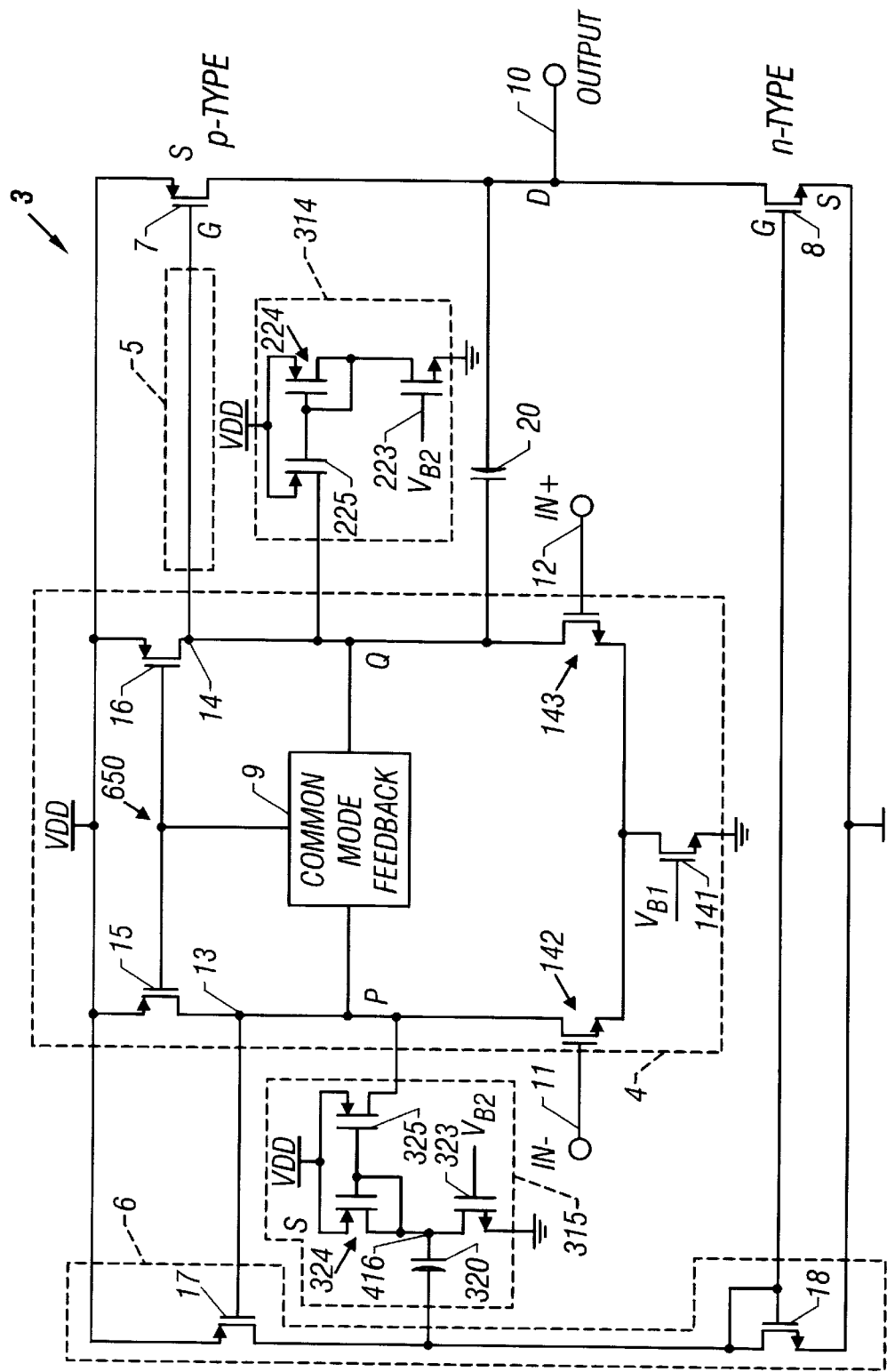
FIG. 6 is another circuit diagram of a class AB operational amplifier having a single-ended output and fully-differential input stages, according to the present invention.

Referring now to FIG. 6, there is shown a circuit diagram of a class AB operational amplifier 3 having a single-ended output and fully-differential input stages, according to a complete amplifier system under the present invention. In particular, FIG. 6 shows operational amplifier 3 including a first operational amplifier stage 4, first and second intermediate stage inverting and non-inverting amplifiers respectively 5 and 6, first and second output transistors respectively 7 and 8, and a common-mode feedback circuitry (CMFB) 9 connected to the first operational amplifier stage 4. Operational amplifier 3 further includes an output connection 10, and first and second input connections to the first operational amplifier stage 4. The first operational amplifier stage 4 further includes first and second output connections respectively 13 and 14, also referred to as first and second intermediate differential nodes, i.e., respectively nodes P and Q. First operational amplifier stage 4 includes a common-mode feedback circuit 9, a transistor 141, first and second input transistors 142 and 143 connected to transistor 141, and a bias network 650 in turn including first and second p-channel transistors 15 and 16. First and second intermediate stage inverting and non-inverting amplifiers 5 and 6 are connected at their respective inputs to respective ones of inputs P and Q (i.e., respectively 13 and 14). According to one embodiment of the present invention, respective output transistors 7 and 8 are complementary metal oxide silicon (CMOS) transistors connected in series between VDD and ground and connected to each other at a common node 10 which is the output connection of operational amplifier 3. According to one embodiment of the present invention, respective output transistors 7 and 8 are respectively p-type and n-type CMOS transistors, each having a source, a drain, and a gate connection. According to one embodiment of the present invention, respective output transistors 7 and 8 are connected to each other at their respective drain connections. According to one embodiment of the present invention, respective output transistors 7 and 8 are respectively connected to VDD and ground at their source connections. According to one embodiment of the present invention, respective output transistors 7 and 8 are connected to the output connections of respective ones of first and second intermediate stage inverting and non-inverting amplifiers 5 and 6 at their respective gate connections. Common-mode feedback circuitry (CMFB) 9 is connected to the first operational amplifier stage 4 and to respective ones of nodes P and Q (i.e., respectively 13 and 14). Compensation capacitor 20 is connected between node 10 and node 14. Current mirror 315 assures that the displacement current going into node 416 is also pulled out of node 13 thus inverting the displacement current. Compensation capacitor 320 is connected between nodes 415 and node 416. Current mirror 315 assures that the displacement current going into node 415 is also pulled out of node 13 (P), causing an inversion of the displacement current. Compensation circuit 315 includes a capacitor 320 and first, second, and third transistors 323, 324, and 325. Transistors 323 and 324 are connected between VDD and ground, and transistors 324 and 325 are current mirrored with respect to each other by connecting the gates of the respective transistors with the drain of transistor 324. Transistor 323 is provided with a predetermined bias voltage VB2 at its gate. A balancing circuit 314 includes first, second, and third transistors 223, 224, and 225. Transistors 224 and 223 are connected in series between VDD and ground. Transistors 224 and 225 are connected to each other in a current mirror arrangement by connecting their respective gates to each other and to the drain of transistor 224. Any gain degradation in the first stage is avoided by cascading the current mirrors. Circuit 314 is similar to circuit 315, and this causes the two sides of the fully differential amplifier structure 4 to look symmetric under DC conditions.

Figure 7:
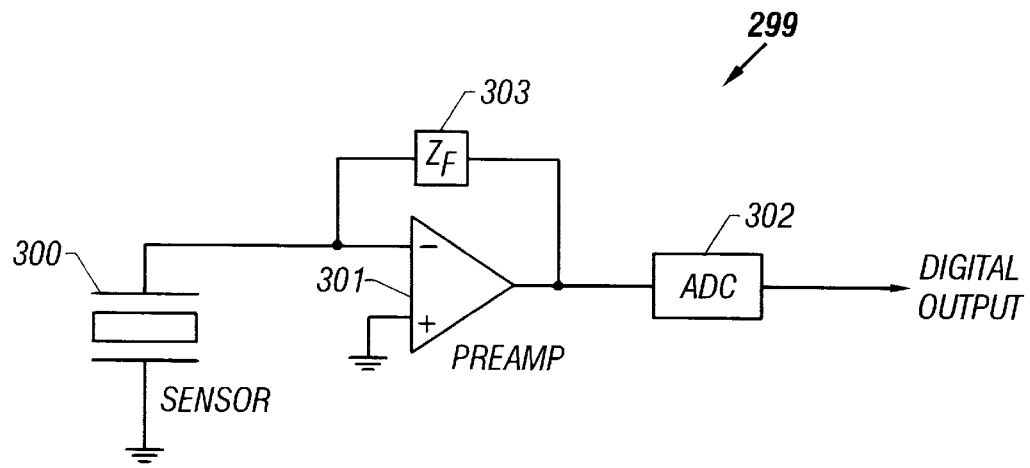
FIG. 7 is a block diagram of a sensor interface circuit according to one embodiment of the present invention, which includes a sensor, a pre-amplifier circuit, an analog-to-digital converter (ADC) circuit, and a feedback circuit.

Referring now to FIG. 7, there is shown a sensor interface circuit 299 according to one embodiment of the present invention, which includes a sensor 300, a pre-amplifier circuit 301, an analog-to-digital converter (ADC) circuit 302, and a feedback circuit 303. The sensor 300 is connected to a negative input terminal of the preamplifier 301, while the positive input of the preamplifier 301 is connected to ground. The feedback circuit 303 is connected between the output connection of the preamplifier 301 and its negative input. The output of the preamplifier 301 is further connected to the input of ADC circuit 302, and the output of the ADC circuit 302 is provided as a digital output of the sensor interface circuit 299, according to one embodiment of the present invention. The preamplifier 301 is an operational amplifier configured according to the present invention.

Figure 8:
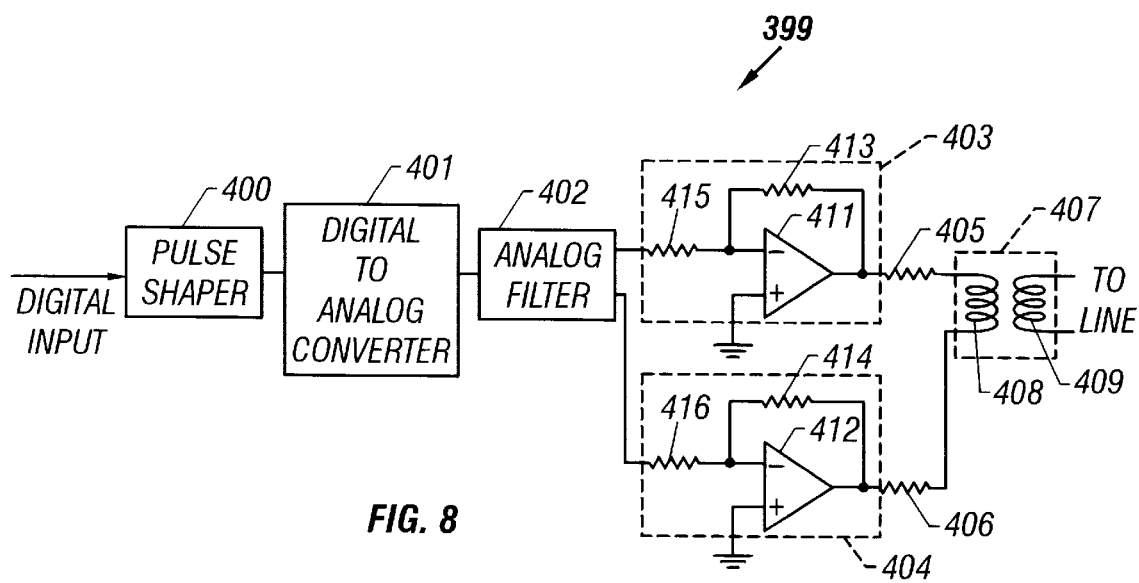
FIG. 8 is a block diagram of a digital subscriber line (DSL) channel circuit according to one embodiment of the present invention, which includes a pulse shaper, an analog-to-digital converter (ADC) circuit, an analog filter circuit, first and second line driver circuits, first and second resistors, and a transformer.

Referring now to FIG. 8, there is shown a digital subscriber line (DSL) channel circuit 399 according to one embodiment of the present invention, which includes a pulse shaper 400, an digital-to-analog converter (DAC) circuit 401, an analog filter circuit 402, first and second line driver circuits respectively 403 and 404, first and second resistors respectively 405 and 406, and a transformer 407. Line driver circuit 403 is configured according to the present invention. According to another embodiment of the present invention, line driver circuit 404 is configured according to the present invention. According to yet another embodiment of the present invention, line driver circuits 403 and 404 are configured according to the present invention. The pulse shaper circuit 400 receives a digital input at an input connection thereof, and at its output, the pulse shaper circuit 400 is connected to a DAC circuit 401, according to one embodiment of the present invention. Further, the DAC circuit 401 is connected at its output to an analog filter circuit 402. Each of line driver circuits 403, 404 has a feedback circuit connected between its output and its negative input terminal. Each of line driver circuits 403, 404 further has an input resistor connected at its negative input terminal. In particular, line driver circuit 403 includes a feedback resistor 413 and an input resistor 415. Further, line driver circuit 404 includes a feedback resistor 414 and an input resistor 416. Input resistors 415 and 416 are connected to output terminals of analog filter 402. Input resistors 415 and 416 are further connected at their respective output terminals to the negative input terminals of respective operational amplifiers 411 and 412. Respective resistors 405 and 406 are connected to the respective output terminals of respective line driver circuits 403 and 404. Transformer 407 includes first and second windings 408 and 409. The input winding 408 of transformer 407 is connected to transistors 405 and 406. The output winding 409 of transformer 407 is connected to a selected communications line for production and transfer of output communication signals.

According to one embodiment of the present invention, a digital subscriber line system comprises first and second operational amplifiers each having a single-ended output and fully-differential input stages, respectively an output connection and first and second input connections, each of said first and second operational amplifiers. The digital subscriber line system further comprises a first operational amplifier stage including first and second output connections, or first and second intermediate differential nodes, i.e., respectively nodes P and Q. The digital subscriber line system comprises first and second intermediate stage inverting and non-inverting amplifiers connected at their respective inputs to respective ones of inputs P and Q. The digital subscriber line system comprises first and second output transistors connected at a common node, including a single-ended output for said operational amplifier, each of said first and second output transistors having a gate connected to the output of said first and second intermediate stage inverting and non-inverting amplifier. The digital subscriber line system further comprises frequency compensating feedback circuitry including a compensation capacitor connected to said single-ended output of the operational amplifier, and further includes a current mirror circuit which is connected to a selected one of the first and second intermediate differential nodes P and Q. The digital subscriber line system comprises an analog filter connected to said first and second operational amplifiers; a digital to analog converter connected to said analog filter; and a pulse shaper connected to said digital to analog converter.

According to the present invention, an electric circuit includes a pre-amplifier which has a single-ended output and fully-differential input stages, respectively an output connection and first and second input connections. The operational amplifier includes a first operational amplifier stage including first and second output connections, or first and second intermediate differential nodes, i.e., respectively nodes P and Q. The operational amplifier further includes first and second intermediate stage inverting and non-inverting amplifiers connected at their respective inputs to respective ones of inputs P and Q. The operational amplifier according to the present invention further includes first and second output transistors connected at a common node, including a single-ended output for said operational amplifier, each of said first and second output transistors having a gate connected to the output of said first and second intermediate stage inverting and non-inverting amplifiers. The operational amplifier further includes frequency compensating feedback circuitry including a compensation capacitor connected to said single-ended output of the operational amplifier. According to one embodiment of the present invention, the frequency compensating feedback circuitry further includes a current mirror circuit which is connected to a selected one of the first and second intermediate differential nodes P and Q. The input of the preamplifier is connected to a sensor.

Operational amplifiers are configured as line drivers in digital subscriber lines (DSL) and as preamplifiers in sensing systems having an input sensor connected to a preamplifier which in turn drives an analog to digital converter. *ADSL and DSL Technologies* by Walter Goralski (McGraw-Hill 1998) describes DSL systems in which such operational amplifiers can be used.

While the invention has been particularly shown and described with reference to a preferred embodiment, it will be understood by those skilled in the art that various changes in form and detail may be made therein without departing from the spirit and scope of the invention.

What is claimed is:

1. An operational amplifier having a single-ended output and fully-differential input stages, respectively an output connection and first and second input connections, comprising:

a first operational amplifier stage including first and second output connections, or first and second intermediate differential nodes, i.e., respectively nodes P and Q;

first and second intermediate stage inverting and non-inverting amplifiers connected at their respective inputs to respective ones of inputs P and Q;

first and second output transistors connected at a common node, including a single-ended output for said operational amplifier, each of said first and second output transistors having a gate connected to the output of said first and second intermediate stage inverting and non-inverting amplifiers; and frequency compensating feedback circuitry including a compensation capacitor connected to said single-ended output of the operational amplifier, and further including a current mirror circuit which is connected to a selected one of the first and second intermediate differential nodes P and Q.

2. The operational amplifier according to claim 1 wherein said compensation capacitor is connected to node Q.

3. The operational amplifier according to claim 1 wherein said compensation capacitor is connected to said single-ended output of the operational amplifier.

4. The operational amplifier according to claim 1 wherein said frequency compensating feedback circuitry includes a current mirror circuit which is connected to a selected one of the first and second intermediate differential nodes P and Q.

5. The operational amplifier according to claim 1 including common-mode feedback circuitry connected to the first operational amplifier stage.

6. The operational amplifier according to claim 1 including first and second current mirror transistors and first and second current sources.

7. The operational amplifier according to claim 6 wherein said first and second current sources are connected at their respective inputs to VDD and at their respective outputs to the first and second current mirror transistors.

8. The operational amplifier according to claim 6 wherein the first and second current sources are connected at their respective outputs to the compensation capacitor and to a selected one of nodes P and Q.

9. The operational amplifier according to claim 6 wherein the second current soure is connected at its output to node P.

10. The operational amplifier according to claim 6 wherein said current mirror transistors are connected to each other at their respective gate connections.

11. An operational amplifier having a single-ended output and fully-differential input stages, respectively an output connection and first and second input connections, comprising:
 a first operational amplifier stage including first and second output connections, and first and second intermediate differential nodes, i.e., respectively nodes P and Q,
 first and second intermediate stage inverting and non-inverting amplifiers connected at their respective inputs to respective ones of inputs P and Q,
 first and second output transistors,
 common-mode feedback circuitry connected to the first operational amplifier stage, and
 feedback circuitry including a compensation capacitor connected to the single-ended output of the operational amplifier, and further including a current mirror circuit which is connected to a selected one of the first and second intermediate differential nodes P and Q.

12. A circuit for an operational amplifier having a single-ended output and fully-differential input stages, respectively an output connection and first and second input connections, comprising a first operational amplifier stage including first and second output connections, and first and second intermediate differential nodes, i.e., respectively nodes P and Q, said circuit comprising:
 a compensation capacitor connected to the single-ended output of an operational amplifier, and
 a current mirror circuit which is connected to a selected one of the first and second intermediate differential nodes P and Q.

13. The circuit according to claim 12 wherein said current mirror circuit includes first and second current sources and first and second transistors respectively connected in series between said first and second current sources and ground.

14. The circuit according to claim 13 wherein said first and second current sources are connected to VDD.

15. The circuit according to claim 13 wherein said first and second transistors respectively include first and second gates which are connected to each other.

16. The circuit according to claim 13 wherein one for said first and second transistors has its drain connected to its gate.

17. The circuit according to claim 12 wherein said current mirror circuit includes first, second, and third current sources and first, second, and third transistors respectively connected in series between said first and second current sources and ground, and said third current source is connected between said third transistor and ground.

18. The circuit according to claim 17 wherein said first and second current sources are connected to VDD.

19. The circuit according to claim 17 wherein said first and second transistors respectively include first and second gates which are connected to each other.

20. The circuit according to claim 15 wherein said first and second current sources includes a transistor.

21. An electrical system comprising:
 an operational amplifier having a single-ended output and fully-differential input stages, respectively an output connection and first and second input connections, including:
  a first operational amplifier stage including first and second output connections, or first and second intermediate differential nodes, i.e., respectively nodes P and Q;
  first and second intermediate stage inverting and non-inverting amplifiers connected at their respective inputs to respective ones of inputs P and Q;
  first and second output transistors connected at a common node, including a single-ended output for said operational amplifier, each of said first and second output transistors having a gate connected to the output of said first and second intermediate stage inverting and non-inverting amplifiers; and
  frequency compensating feedback circuitry including a compensation capacitor connected to said single-ended output of the operational amplifier, and further including a current mirror circuit which is connected to a selected one of the first and second intermediate differential nodes P and Q;
 a sensor connected to said operational amplifier; and
 an analog-to-digital converter connected to said operational amplifier.

22. The electrical system according to claim 21 wherein said operational amplifier is connected at its input to said sensor.

23. The electrical system according to claim 21 wherein said operational amplifier is connected at its output to said analog-to-digital converter.

24. The electrical system according to claim 21 wherein said operational amplifier is configured as a pre-amplifier.

25. The electrical system according to claim 21 further comprising a feedback impedance connected between input and output of said operational amplifier.

26. The electrical system according to claim 25 wherein said operational amplifier includes inverting and non-inverting input connections and said feedback impedance is connected between the output of said operational amplifier and its inverting input connection.

27. An electrical system comprising:
 first and second operational amplifiers each having a single-ended output and fully-differential input stages, respectively an output connection and first and second input connections, each of said first and second operational amplifiers including:
- a first operational amplifier stage including first and second output connections, or first and second intermediate differential nodes, i.e., respectively nodes P and Q;
- first and second intermediate stage inverting and non-inverting amplifiers connected at their respective inputs to respective ones of inputs P and Q;
- first and second output transistors connected at a common node, including a single-ended output for said operational amplifier, each of said first and second output transistors having a gate connected to the output of said first and second intermediate stage inverting and non-inverting amplifiers; and
- frequency compensating feedback circuitry including a compensation capacitor connected to said single-ended output of the operational amplifier, and further including a current mirror circuit which is connected to a selected one of the first and second intermediate differential nodes P and Q; and an analog filter connected to said first and second operational amplifiers.

28. The electrical system according to claim 27 further including an analog filter connected to each of said operational amplifiers.

29. The electrical system according to claim 27 wherein each of said operational amplifiers is connected at its output to a transfomer.

30. The electrical system according to claim 27 wherein each of said operational amplifiers is configured as a line driver.

31. The electrical system according to claim 27 further comprising a feedback impedance connected between input and output of each said operational amplifier.

32. The electrical system according to claim 27 wherein each of said operational amplifiers includes inverting and non-inverting input connections and said feedback impedance is connected between the output of the particular operational amplifier and its respective inverting input connection.

33. A digital subscriber line system comprising:
first and second operational amplifiers each having a single-ended output and fully-differential input stages, respectively an output connection and first and second input connections, each of said first and second operational amplifiers including:
- a first operational amplifier stage including first and second output connections, or first and second intermediate differential nodes, i.e., respectively nodes P and Q;
- first and second intermediate stage inverting and non-inverting amplifiers connected at their respective inputs to respective ones of inputs P and Q;
- first and second output transistors connected at a common node, including a single-ended output for said operational amplifier, each of said first and second output transistors having a gate connected to the output of said first and second intermediate stage inverting and non-inverting amplifiers; and
- frequency compensating feedback circuitry including a compensation capacitor connected to said single-ended output of the operational amplifier, and further including a current mirror circuit which is connected to a selected one of the first and second intermediate differential nodes P and Q;

an analog filter connected to said first and second operational amplifiers;

a digital to analog converter connected to said analog filter; and a pulse shaper connected to said digital to analog converter.

34. A method for modifying electric current flowing through a compensation capacitor coupled between first and second nodes, comprising:
- determining an output current flowing through the compensation capacitor coupled to a single-ended output of an operational amplifier wherein the compensation capacitor is configured to produce the output current equal to an input current, and
- replicating, by a current mirror circuit coupled to the first and second nodes of the operational amplifier, the output current flowing in an opposite direction.

35. The method of claim 34, including providing the replicated, opposite current to said second node in lieu of the output current from the capacitor.

36. A method for modifying electric current flowing through an electric compensating circuit coupled between first and second nodes, comprising:
- determining an output current flowing through the electric compensating circuit coupled to a single-ended output of an operational amplifier wherein the electric compensating circuit is configured to produce the output current equal to an input current, and
- replicating, by a current mirror circuit coupled to the first and second nodes of the operational amplifier, the output current flowing in an opposite direction.

37. The method of claim 34 including providing the replicated, opposite current to said second node in lieu of the output current from the electric circuit.

* * * * *